Dec. 2, 1969 TSU-FANG CHEN 3,481,354

PURE FLUID AMPLIFIER WITH ADJUSTABLE CONTROL ELEMENTS

Filed Sept. 7, 1967

United States Patent Office 3,481,354

Patented Dec. 2, 1969

3,481,354
PURE FLUID AMPLIFIER WITH ADJUSTABLE CONTROL ELEMENTS

Tsu-Fang Chen, Plymouth Meeting, Pa., assignor to Sperry Rand Corporation, New York, N.Y., a corporation of Delaware Filed Sept. 7, 1967, Ser. No. 666,017
Int. Cl. F15c *1/14*
U.S. Cl. 137—81.5 3 Claims

ABSTRACT OF THE DISCLOSURE

A pure fluid amplifier is provided in which adjustable restrictor elements are included in the control channels thereof. By trimming the restrictor elements a single amplifier design can be made to operate either in the bistable or the monostable modes and the gain and the noise sensitivity of the amplifier can be controlled.

This invention relates to a pure fluid amplifier having low-power-consumption and in particular to a novel means for lowering the power supply pressure and controlling the operating characteristics of the amplifier.

Pure fluid amplifiers of both the so-called boundary layer control class and also the so-called momentum exchange class are now well known in the art. At present the power consumption of these devices is in the range of .5 to 1 watt. Reduction of the power consumption to the milliwatt level is therefore a needed improvement in order for them to become useable in large and complex logic configurations. One purpose of this invention is therefore to provide an amplifier which operates in the milliwatt range.

Bistable amplifiers of the so-called boundary layer control class depend in their reliability on obtaining almost perfect geometric symmetry. For example, the power divider must be almost perfectly aligned with the power jet. The side walls of the interaction chamber must be almost precisely symmetrically arranged with respect to the power nozzle and the divider and so forth. Otherwise if these conditions are not met the power jet will favor one output channel or the other and the noise sensitivity, gain characteristics and switching characteristics of the amplifier will vary from one control input to the other. Achieving this type of symmetry on a mass production basis is nearly impossible. Therefore, it is another purpose of this invention to provide an amplifier which has a built-in adjustability feature to it, to permit the amplifier operating characteristics to be easily manually adjusted so as to achieve highly reliable bistable operation or in the alternative, if desired, monostable operation.

BRIEF SUMMARY

In accordance with the present invention, a standard single design pure fluid amplifier is provided. The basic configuration is that of a bistable type amplifier. An adjustable restrictor element is located in each of the control channels of the amplifier. By adjusting the effect of the restrictor elements the operating characteristics of the amplifier can be varied so that the amplifier operates as a highly reliable bistable device or as a monostable device. Inclusion of the restrictor elements is also effective to permit the amplifier to operate at lower supply pressure levels and therefore at lower power consumption levels.

Figure 1:
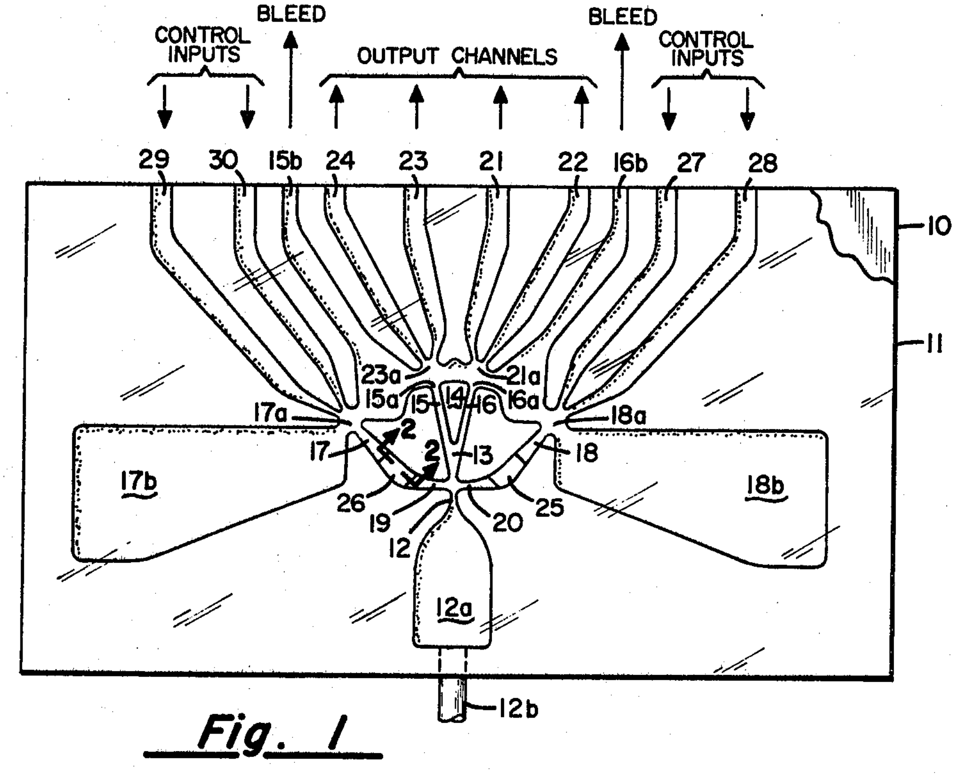
FIGURE 1 is an elevational view of a preferred embodiment of my invention.

Referring now to FIGURE 1 there is shown an elevational view of a preferred embodiment of the present invention. The fluid amplifier comprises a main body member 10 and a cover plate 11. The body member may be made of a molded plastic material having the various channel configurations formed therein as shown in the figure. The cover plate 11 may comprise a light-weight, pressure-sensitive transparent tape sealed to the top surface of the body member 10.

The basic amplifier of this invention comprises an interaction chamber designated 13. Located downstream in the interaction chamber is a conventional wedge-shaped flow splitter 14 which together with the side walls of the interaction chamber 13 form a pair of output channels designated 15 and 16. Each of the output channels 15 and 16 communicate across an isolation gap **15*a* and 16*a* with a pair of output ducts 21 and 22 for channel 16 and 23 and 24 for channel 15. The isolation gaps 15*a* and 16*a* themselves may communicate through suitable bleed ducts designated 15*b* and 16*b* to atmosphere or to a low pressure sink. Entering the interaction chamber is a power nozzle 12 which is symmetrically located with respect to the apex of the divider 14. The power nozzle 12 couples through a suitable pressure chamber 12*a* and thence through a hose fitting device 12*b*** to a supply pressure source not shown.

A pair of control nozzles 19 and 20 are located on opposite sides of the power jet 12 and are arranged so that upon being charged with a control fluid they will switch the power jet issuing from nozzle 12 to the left output channel 15 or the right output channel 16. The control nozzles 19 and 20 are each connected through suitable control channels 17 and 18 to a pair of respective input control ducts 27, 28 and 29, 30. The latter control ducts themselves are coupled in an "OR" gate fashion to the input control channels 17 and 18 across isolation gaps **18*a* and 17*a*. In more particular, input control ducts 27 and 28 converge at the isolation gap 18*a* so that a fluid signal applied to either duct 27 or 28 will be coupled across gap 18*a* to control channel 18. Similarly, a fluid signal applied to either control duct 29 or 30 will be coupled across gap 17*a* to control channel 17. It should be noted that in the formation of the isolation gaps 17*a* and 18*a* in the control channels, one side of each of the gaps communicates with the bleed channels 15*b* and 16*b* previously mentioned. The other side of the gaps 17*a* and 18*a* open into respective cavity areas 18*b* and 17*b* which can be extended to bleed sideways, normal to the device plane or bled through the above-described ducts 15*b* and 16*b***.

The fore-described amplifier is symmetrical in design and operates basically as a bistable type device. Specifically, a jet issuing from the power nozzle 12 will, due to the Coanda or boundary layer control effect, attach itself to one of the sidewalls right or left defining the interaction chamber 13 and pass out the corresponding output duct 15 or 16 and then across the associated gap **15*a* or 16*a* and out the corresponding output channels 21 and 22 or 23 and 24. In this regard the divider tips 21*a* and 23*a* formed by the land area between the output ducts operates to split the enegy of the jet issuing from the corresponding output channel 15 or 16 equally into the corresponding output ducts 21 and 22 or 23 and 24**.

Once the power jet has locked onto one of the sidewalls in the interaction chamber a control signal must be applied to the appropriate control input channel 17 or 18 to dislodge the jet and deflect it to the opposite output channel. For instance, if the channel 15 is the active channel then a control input must be applied to one of the input ducts 29 or 30 to switch the power jet to the output channel 16. Alternatively, if the power jet is issuing from output channel 16 then a control signal input must be applied to one or both the control ducts 27 or 28 to switch the power jet to channel 15.

As previously mentioned the amplifier described is symmetrical in design and normally bistable in operation. Ideally the amplifier will exhibit symmetrical properties; that is, the outputs 15 and 16 should be able to drive equal level loads and the amplifier should switch between outputs 15 and 16 in response to equal level input control signals. It has been found, however, that in the fabrication of bistable devices of this type it is difficult to reliably obtain these symmetrical properties on a mass production basis. As a result the production yield of bistable amplifiers is quite low and the cost of producing acceptable amplifiers is therefore rather high. To overcome this shortcoming I provide an amplifier in which adjustable control elements are built into the design. These adjustable elements are arranged to be readily manually trimmed or adjusted so as to render the amplifier symmetrical in its operating characteristics. In the alternative and through these adjustable elements which will now be described, it is possible to convert the baic bistable element of FIGURE 1 into a monostable element where the power jet will normally pass through one output channel or the other.

Figure 2:
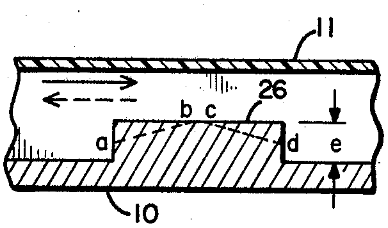
FIGURE 2 is a cross-sectional view of one of the control channels of FIGURE 1 taken along the line 2—2 and showing a typical built-in restrictor element.

The adjustable elements to which applicant refers comprises a pair of restrictor blocks 25 and 26 located in the control channels 17 and 18 of the amplifier. These restrictor blocks are formed in the initial molding of the amplifier and in effect comprise raised protuberances integrally formed in the control ducts 17 and 18. A sectional view of one such restrictor block is shown in FIGURE 2. These blocks have many functions, one of which is to throttle the entrainment of air in the control channel 17 or 18 during the operation of the amplifier to thereby control the power supply pressure at which the Coanda effect comes into play. In this regard it has been observed that without the restrictor blocks a certain predetermined minimum Reynolds number must be achieved in the flow of the power jet to form a vacuum bubble and therefore to produce the Coanda effect in the amplifier. With the inclusion of the restrictor blocks, however, the formation of the vacuum bubble takes place at considerably lower Reynolds' numbers. The significance of this improvement is that lower supply pressures are required to produce the Coanda effect and therefore lower power consumption results in the amplifier.

In the fabrication of the amplifier the restrictor blocks are initially formed so that their effect will permit the formation of a vacuum bubble at a certain range of input power pressures. For example, in one design pressure levels ranging from 4 to 8 inches in water gauge were used. After the amplifier has been constructed it is tested to determine its symmetry of operation. If a certain imbalance in the operaton of the amplifier is observed, that is for example, that a larger control signal must be applied to switch the amplifier from one output to the other, then by means of a cutting tool the profile or the height of the appropriate one or both of the fluid restrictor elements may be trimmed. For example, assume that the power jet favors output channel 15. To restore balance in amplifier operation the restrictor 26 may be trimmed. Similarly, if a larger input signal is required to switch the power jet away from channel 16 than away from channel 15, then the restrictor 25 may be trimmed. The trimming may be by shaping the profile of the restrictor block by cutting along lines *ab* or *cd* or both *ab* and *cd* as shown in FIG. 2 or by lowering the height *e* of the block.

In the alternative if one wishes to make a monostable element it is only necessary to eliminate or substantially reduce one of the restrictors 25 or 26 to thereby remove the impedance to the air entrainment occurring in the corresponding input duct. For example, if it is desired to make the amplifier of FIGURE 1 monostable with its normal path of output flowing out output channel 15, the restrictor 25 could be removed or reduced in size and shape to a point where a severe imbalance exists in the entrainment between the ducts 17 and 18 in such a manner that the power jet will normally favor output channel 15. In this embodiment only the control inputs 29 and 30 would be used to apply input signals to the amplifier. The output ducts 21 and 22 would in this case produce the direct outputs from the amplifier and the output ducts 23 and 24 would operate to produce the inverted output signals from the amplifier.

The location of the restrictors 25 and 26 in the control channels is not particularly critical, however, as shown in the drawings the control channels themselves are curved or bowed so as to permit air from the input control ducts 27 and 28 or 29 and 30 to turn a corner in reaching the control nozzles 19 and 20. In the region of the curve the input channels 17 and 18 are also enlarged to form a low velocity area and for convenience the location of the restrictor at this point in the control duct is preferred since this area provides a larger and more readily adjustable restrictor block.

Another important consideration in the construction of the amplifier is in the formation of the isolation gaps 17*a* and 18*a* in the control channels themselves. The reason that the use of isolation gaps at this point is significant is that they isolate the impedance of the control input ducts 27 and 28 or 29 and 30 from the control channels 17 and 18 and thereby isolate the effect of ducts 27 and 28 or 29 and 30 from the control channels 17 or 18 whereby the impedance offered by the restrictor blocks 25 and 26 becomes more effectual in controlling the performance of the amplifier.

In a typical embodiment of the present invention the depth of all the channels formed in the base member 10 and defining the amplifier was set at 46 mils. The power nozzle width was set at 13 mils. The restrictor block height *e* was set at 26 mils leaving thereby a 20 mil clearance as shown in FIGURE 2. The length of the restrictor was 80 mils. The width of the output channels 21 and 22 or 23 and 24 at their recovery ends was set at 25 mils. The input control nozzle 19 and 20 was set at 13 mils width. The isolation gap was set at 26 mils in length. The angle of the output channels relative to the axis of symmetry of the divider and power nozzle can vary over a considerable range. Angles of 15 to 30 degrees were found to be good. The supply pressure as previously indicated can vary from 4 to 8 inches in water gauge.

One of the advantages of the present invention is that it improves greatly the production yield of amplifiers made according to this invention. In more particular the amplifiers can be molded as indicated and in the testing of these amplifiers if good symmetry is found those which exhibit this symmetry can be marked suitable for bistable applications. Those, however, that are found to favor to a large degree one output channel or the other can have their associated restrictor blocks trimmed to a point where the amplifier becomes completely reliable as a monostable device. Those amplifiers which exhibit a small asymmetry in operation can have their respective restrictor blocks trimmed or shaped as previously indicated so as to restore completely or almost so the symmetry of their operation rendering them now useful as bistable devices. Thus by means of the trimming adjustments which are available in the form of restrictor blocks 25 and 26 the amplifier can be converted to a highly reliable bistable element or to a suitable and usable monostable element.

Figure 3:
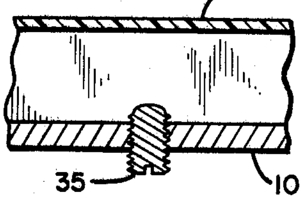
FIGURE 3 is a cross-sectional view of a control channel showing one further typical type of adjustable restrictor element.

FIGURE 3 shows an alternate type of fluid restrictor which can also be utilized in the present invention. As here shown a simple plastic screw 35 is threaded into the base of the body member 10 and by turning the screw counter-clockwise or clockwise its penetration into the control channel is varied and therefore its effect as a restrictor element is varied. It is of course obvious that other types of restrictor flow control or implementation will occur to those skilled in the art.

The embodiments of the invention in which an exclusive property or privilege is claimed are defined as follows:

1. A fluid amplifier comprising, a fluid interaction chamber formed by a pair of spaced, divergent side wall members symmetrically disposed relative to a center line passing through said interaction chamber, a fluid power nozzle entering said chamber along the center line thereof, a fluid divider element located in said chamber and spaced down stream from said power nozzle, said divider element being spaced from said side walls so as to form a pair of fluid outlet channels between the divider and the respective side walls, said divider element and the angle of divergence of said side walls being set so that said amplifier exhibits a Coanda effect, a pair of fluid control nozzles one on each side of said power nozzle, a pair of fluid control channels one interconnected to each of said control nozzles, an isolation gap formed in each of said fluid control channels, and an adjustable restrictor element located in at least one of said control channels between the isolation gap therein and the associated control nozzle, said restrictor element providing an adjustable impedance in the control channel whereby the operating characteristics of the amplifier may be modified.

2. A structure as set forth in claim 1 wherein the restrictor element is integrally formed in the control channel.

3. A structure as set forth in claim 1 wherein the restrictor element is adjusted to effectively lower the Reynolds number at which the Coanda effect occurs in the amplifier.

References Cited

UNITED STATES PATENTS

| | | | |
|---|---|---|---|
| 3,182,686 | 5/1965 | Zilberfarb | 137—81.5 X |
| 3,272,214 | 9/1966 | Warren | 137—81.5 |
| 3,326,463 | 6/1967 | Reader | 137—81.5 X |
| 3,335,737 | 8/1967 | Gesell | 137—81.5 |

M. CARY NELSON, Primary Examiner

W. R. CLINE, Assistant Examiner